(12) United States Patent
Tager

(10) Patent No.: US 6,639,948 B1
(45) Date of Patent: Oct. 28, 2003

(54) FRACTIONAL DELAY DIGITAL FILTER

(75) Inventor: Wolfgang Tager, Lannion (FR)

(73) Assignee: France Telecom, Paris (FR)

( * ) Notice: Subject to any disclaimer, the term of this patent is extended or adjusted under 35 U.S.C. 154(b) by 0 days.

(21) Appl. No.: 09/402,125

(22) PCT Filed: Mar. 26, 1998

(86) PCT No.: PCT/FR98/00615

§ 371 (c)(1),
(2), (4) Date: Dec. 6, 1999

(87) PCT Pub. No.: WO98/44629

PCT Pub. Date: Oct. 8, 1998

(30) Foreign Application Priority Data

Mar. 28, 1997 (FR) .............................................. 97 03845

(51) Int. Cl.$^7$ .............................................. H04B 15/00
(52) U.S. Cl. ........................ 375/285; 375/296; 375/349; 375/350; 708/300
(58) Field of Search ................................ 375/260, 285, 375/296, 346, 349, 350, 259, 232, 230; 708/300, 229

(56) References Cited

U.S. PATENT DOCUMENTS 5,654,909 A * 8/1997 Sun .............................. 708/300
5,691,929 A * 11/1997 Sun .............................. 708/300
5,926,455 A * 7/1999 Allpress ....................... 370/210

OTHER PUBLICATIONS

Cetin A E et al.: "Digital Interpolation BeamForming Using Recursive Filters" Journal of the Acoustical Society of America; vol. 85, No. 1 Jan. 1, 1989.

Sangil Park: "Real Time Pitch Shifting Techniques" ICCE Jun. 5–7, 1991.

T.I. Laakso et al. "Splitting the Unit Delay, Tools for Fractional Delay Filter Design" IEEE Signal Processing Magazine, vol. 13, No. 1, Jan. 1996.

* cited by examiner

Primary Examiner—Jean B. Corrielus
(74) Attorney, Agent, or Firm—Blakely, Sokoloff, Taylor & Zafman

(57) ABSTRACT

A device is presented for processing digital signals conveyed between a common port and many particular ports. The device includes a linear processing module. The module includes filters, which simultaneously apply a phase-shift and a chosen amplitude emphasis at each of the particular ports. The phase-shift is specific to each particular port, and the amplitude emphasis is substantially the same for all the particular ports. At the common port, the device also includes a common inversion filter, which performs inverse amplitude emphasis to the chosen amplitude emphasis.

17 Claims, 11 Drawing Sheets

FRACTIONAL DELAY DIGITAL FILTER

This application claims priority under 35 U.S.C. §365(a) from International Application No. PCT/FR98/00615, filed Mar. 26, 1998, and published under PCT Article 21(2), on Oct. 8, 1998, in French, which is hereby incorporated by reference.

BACKGROUND OF THE INVENTION

1. Field of the Invention

The present invention concerns digital signal processing devices which perform fractional delay operations in a linear processing context.

The theory of such devices is well known. Conventionally, and as shown in FIG. 1, these devices comprise on the input side a row of finite impulse response interpolation filters each of which performs a fractional delay operation specific to each input signal.

Each finite impulse response interpolation filter is an approximation of an ideal fractional delay filter. The coefficients of the finite impulse response interpolation filters are calculated using either conventional methods which minimize the mean square error or the Lagrange method.

The delayed signals are then each subjected to specific linear processing, after which they are added. There are also similar devices using an arrangement which is the opposite of that just mentioned. In this case, the same input signal is duplicated to provide a plurality of signals identical to it, which signals are then subject to specific linear processing and a specific fractional delay operation. Such devices are used in voice coders employing fractional pitch resolution, for example.

2. Description of Related Art

FIGS. 1 to 3 show a prior art digital device in which M input signals $u_1, u_2, \ldots, u_M$ are delayed before they are subjected to linear processing by a filter $T_1$ through $T_M$ and added by an adder S. This type of device is used in conventional applications, for example antenna processing, in which case the delays are chosen as a function of the antenna pointing angle.

The required delay $r_k$ is rarely an integer multiple of the sampling period. The delay $r_k$ therefore comprises an integer number of sampling periods to which a non-zero fraction $\tau$ of a period is added. Delays which are a multiple of the sampling period are not considered hereinafter because they are particularly simple to implement. The delays to be obtained are considered to consist of this additional fraction of a sampling period.

The device shown in FIGS. 1 to 3 is fed with M input signals $u_k$ where k varies in the range from 1 to M. As shown in FIG. 1, each of the M input signals $u_k$ is delayed by a fractional delay $r_k$ specific to it.

A finite number of fractional delays $r_k$ is therefore required. A highest common factor $r_o$ of the fractional delays $r_k$ can be found. In practice an interpolation filter is implemented for each multiple of $r_o$ in the range from zero and the value of the sampling period $T_e$. As shown in FIG. 2, D interpolation filters $h_i$, denoted $R_0, R_1, \ldots, R_{D-1}$ are obtained in this way, producing delays of value $$\frac{i}{D} \times T_e,$$

where i varies in the range from 0 to (D−1).

Because the same number L of coefficients is chosen for each filter, D filters $h_i(n)$ are obtained, where i varies in the range from 0 to (D−1) and n varies in the range from 0 to (L−1).

As shown in FIG. 3, each input signal $u_k$, where k varies in the range from 1 to M, is submitted to an interpolation filter $h_{\tau k}(n)$, denoted $RF_k$, which is one of the D filters $h_i(n)$ denoted $R_i$ in FIG. 2, i being in the range from 0 to (D−1).

The equations and the criteria used to calculate the coefficients $h_{i(n)}$ of the D interpolations $R_0$ to $R_{D-1}$ will now be summarized.

Let $\tau_k$ denote the normalized fractional delay value, that is to say $$\tau_k = \frac{r_k}{T_e}$$

where $r_k$ is the required fractional delay for the signal and $T_e$ is the sampling period.

Let $u_k(n)$ be the input signal obtained by sampling an analog $u_k^0(t)$. Assuming that the sampling was done correctly, it is theoretically possible to obtain the delayed digital signal, defined as the samples of the analog signals delayed by $u_k(n)$, from $u_k^0(t-\tau_k T_e)$. The skilled person knows that from the signal $u_k(n)$, all samples of which are known, the corresponding analog signal $u_k^0(t)$ can be found using the interpolation equation $$u_k^0(t) = \sum_{m=-\infty}^{\infty} u_k(m) \frac{\sin\left(\pi\left(\frac{1}{T_e} - m\right)\right)}{\left(\frac{1}{T_e} - m\right)} = \sum_{m=-\infty}^{\infty} u_k(m)\operatorname{sinc}\left(\frac{1}{T_e} - m\right)$$

in which case the delayed analog signal $r_k$ is $$u_k^0(t - r_k) = \sum_{m=-\infty}^{\infty} u_k(m)\operatorname{sinc}\left(\frac{t - r_k}{T_e} - m\right) = \sum_{m=-\infty}^{\infty} u_k(m)\operatorname{sinc}\left(\frac{t}{T_e} - \tau_k - m\right)$$

The delayed digital signal $u_k^{ret}(n)$ is then obtained from:

$$u_k^{ret}(n) = u_k^0(nT_e - r_k)$$

that is:

$$u_k^{ret}(n) = \sum_{m=-\infty}^{\infty} u_k(m)\operatorname{sinc}(n - \tau_k - m) = h_{ideal,\tau k}(n) * u_k(n)$$

where the symbol * symbolizes the convolution operation and where $h_{ideal,\tau k}(n) = \operatorname{sinc}(n - \tau_k)$.

The transfer function in the frequency domain of the filter $h_{ideal,\tau k}$ is $$h_{ideal,\tau k}(f) = e^{-j2\pi \frac{f}{f_e} \tau_k}.$$

In theory, there is therefore an ideal filter $h_{ideal,\tau k}$ enabling the delayed sampled signal to be obtained from the sampled signal $u_k$.

A filter of this kind cannot be implemented in practice because:

the summation is infinite, and the filter is non-causal, i.e. it would be necessary to know the future samples to calculate the result.

The non-causal aspect means that it is only possible to approximate a version having an additional constant delay $\tau_0$ denoted $h_{ideal,\tau+\tau 0}(n)$.

In practice, and as shown in FIG. 3, a known process is used to obtain a filter $h_\tau$ having a finite number L of coefficients and constituting a good approximation of the filter $h_{ideal,\tau+\tau 0}$.

Finite impulse response filters are used in the most widespread applications. It is more difficult to design infinite impulse response filters and they require greater computation accuracy because the data is looped and computation errors can accumulate. Moreover, in a non-static environment, such as antenna processing, the long memory of the filters can be a problem: for example, it is difficult to change the pointing direction of an antenna suddenly.

All-pass filters, a subset of infinite impulse response filters, have the beneficial property of a constant modulus. The absence of amplitude error is unfortunately accompanied by an increased phase error compared to finite impulse response filters of the same complexity. To avoid these problems only finite impulse response filters are used.

Various methods are available for calculating the coefficients $h_\tau(n)$ of a finite impulse response filter $h_\tau$ approximating $h_{ideal,\tau+\tau 0}$.

When a finite number L of coefficients of the FIR filter has been chosen, a first method entails choosing a set of coefficients $h_\tau(n)$ with n varying in the range from 0 to (L-1) which minimizes the mean square error $\int |E_\tau(f)|^2 df$, where $$E_\tau(f) = \sum_{n=0}^{L-1} h_\tau(n) e^{-j2\pi \frac{f}{f_e} \tau} - H_{ideal,\tau+\tau_0}(f)$$

$f_e$ being the sampling frequency and the integration being formed over a wanted frequency band.

$E_\tau(f)$ is often used to define cost functions used to assess the quality of a filter. This method is referred to as method M1. Its result is a truncated and delayed version of the ideal filter $h_{M1,\tau}(n)=\text{sinc}(n-\tau_0-\tau)$.

A second method entails first calculating the coefficients $h_\tau(n)$ using the previous method and then multiplying them by an apodization window $w(n)$. This method is referred to as method M2. Its effect is to smooth the frequency response of the filter.

If $h_{M1,\tau}(n)$ are the coefficients of the filter obtained by the previous method, the coefficients $h_{M2,\tau}(n)$ are obtained from the equation $h_{M2,\tau}(n)=h_{M1,\tau}(n)\cdot w(n)$ where, for example, $$w(n) = 0.54 - 0.46\cos\left(\frac{2\pi n}{L-1}\right) w(n)$$

is known as the Hamming window.

A third method entails adopting the set of coefficients $h_\tau(n)$ which minimize the generalized mean square error $C_\tau = \int W(f)|E_\tau(f)|^2 df$, where $W(f)$ is a frequency domain weighting function which can be modulated iteratively to obtain a satisfactory function $h_{M3,\tau}(n)$ and where the integration is performed over a wanted frequency band. This method is referred to as method M3. It yields a linear system of equations.

A fourth method entails adopting the coefficients $h_\tau(n)$ for which $$\left(\frac{\delta^m E_\tau(f)}{\delta f^m}\right)\bigg|_{f=0} = 0,$$

where m varies in the range from 0 to (L-1). This method is referred to as method M4. The coefficients $h_{M4,\tau}(n)$ are obtained from:

$$h_{M4,\tau}(n) = \prod_{\substack{k=0 \\ k \neq n}}^{L-1} \frac{\tau - k}{n - k}$$

Many examples and a comparison of infinite impulse response and finite impulse response filters can be found in an article in the IEEE signal processing magazine, January 1996, "Splitting the unit delay, tools for fractional delay filter design", by Laakso, Välimäki, Karjalainen, Laine.

FIG. 3 shows that each input signal $u_k$ is then submitted to a delayed filter $h_{\tau_k}(n)$, denoted $RF_k$, where $\tau_k$ is the normalized delay specific to the signal $u_k$ and is one of the values i/D where i varies in the range from 0 to (D−1).

The device shown in FIGS. 1 to 3 therefore performs delay operations on M signals with interpolation filters $RF_1, \ldots RF_M$ of length L, which represents $C_1=M\times L$ operations, where an operation is defined as a multiplication followed by an addition. Also, the memory needed to store the L coefficients of the D filters is $C_2=D\times L$ words.

Such devices are not totally satisfactory. If the number of signals to be delayed is large, the computation load C1 and the memory capacity C2 needed to store the coefficients of the interpolation filters are so large that they make the devices extremely costly to implement and therefore compromise their economic viability.

BRIEF SUMMARY OF THE INVENTION

The aim of the invention is to propose a digital processing device which performs the same processing with the same accuracy but with greatly reduced computation load and memory requirement.

The above aims are achieved in accordance with the invention by a device for processing digital signals conveyed between a common port and M particular ports including a linear processing module characterized in that it includes particular filters which apply at the same time a phase-shift and a chosen amplitude emphasis at each of the M particular ports, said phase-shift being specific to each particular port and the amplitude emphasis being substantially the same for all the particular ports, and in that it includes at said common port a common inversion filter which performs the inverse amplitude acceleration through said chosen amplitude emphasis.

According to the invention, the common port can be an input port or an output port.

BRIEF DESCRIPTION OF THE DRAWINGS

Other features, aims and advantages of the present invention will become apparent on reading the following detailed description with reference to the accompanying drawings, which are given by way of non-limiting example and in which.

DETAILED DESCRIPTION OF THE INVENTION

Figure 1:
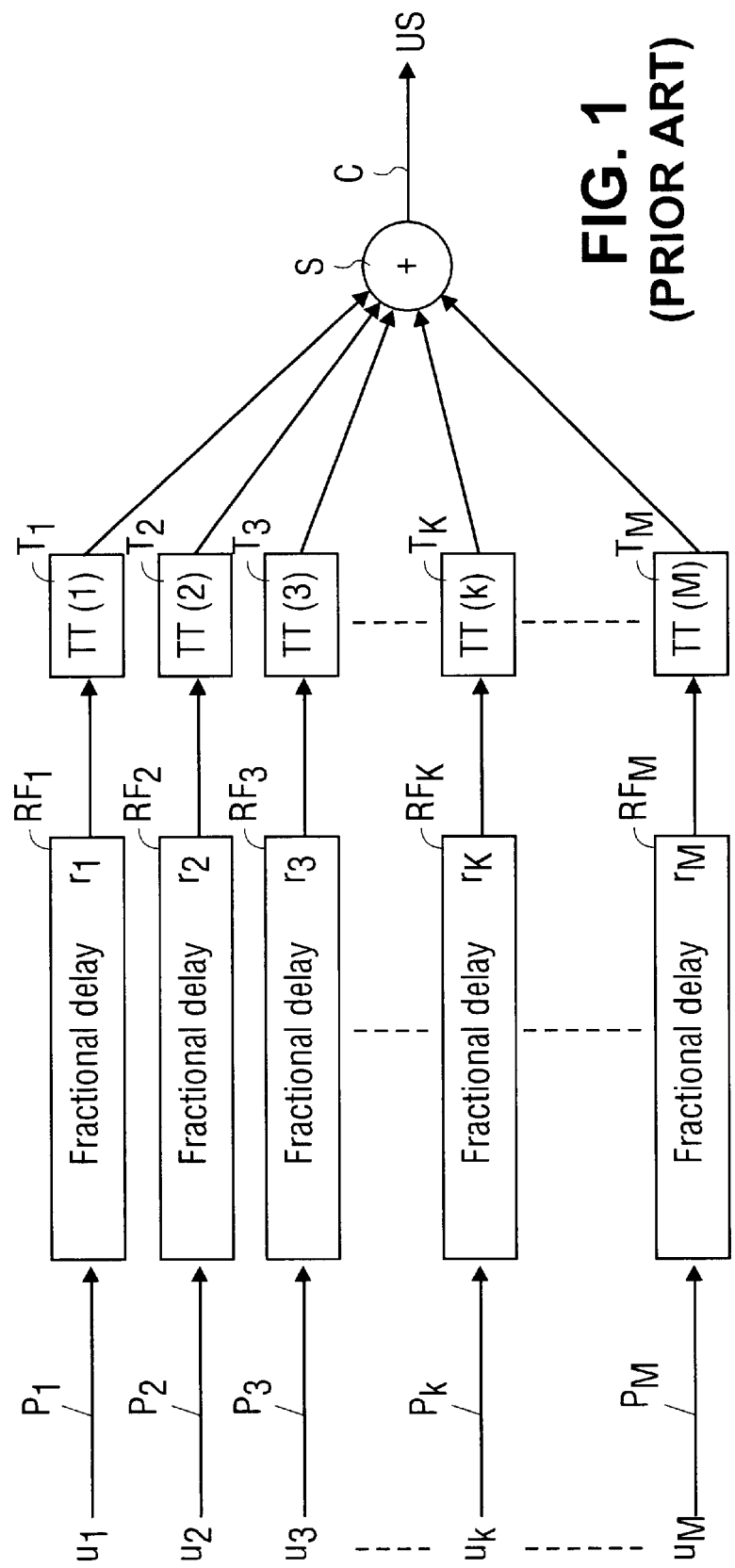
FIG. 1 is a functional block diagram of a prior art digital system applying specific fractional delay and linear processing operations to input signals.
Figure 2:
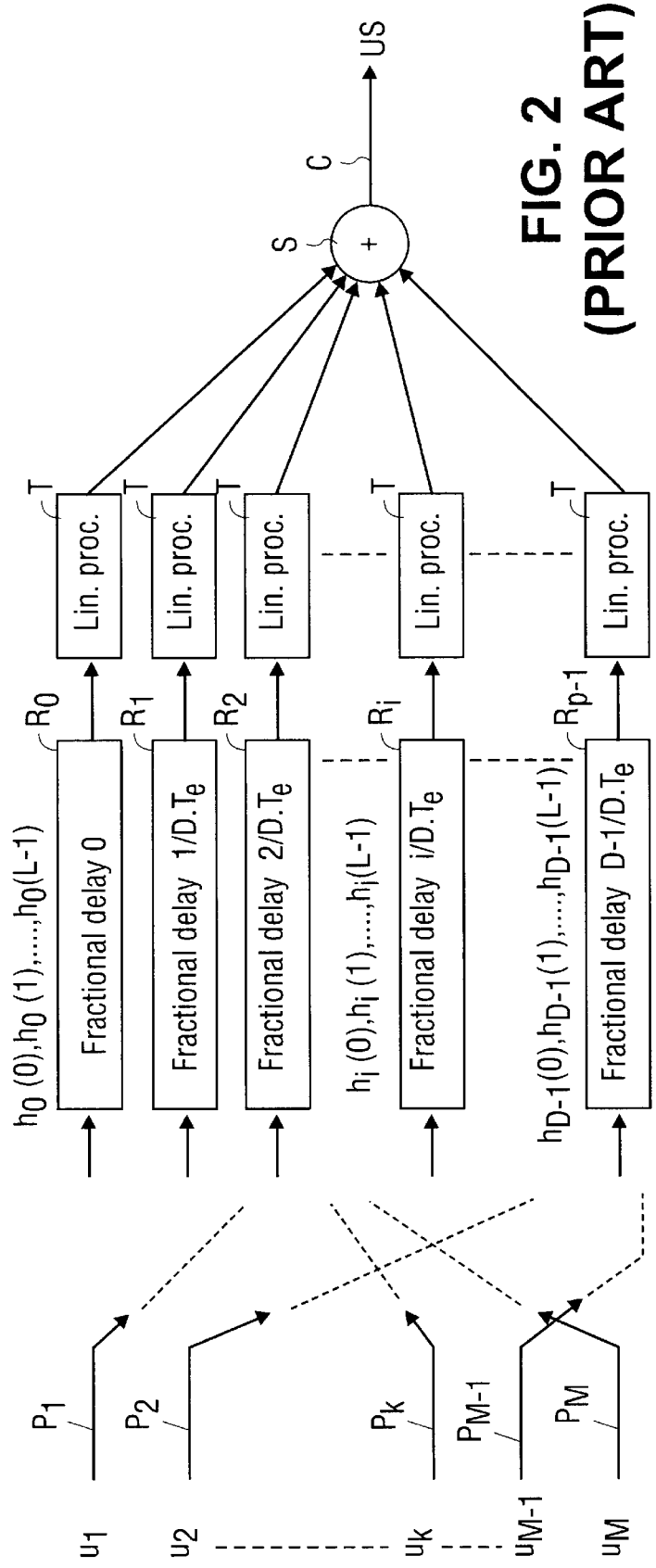
FIG. 2 shows the same device, emphasizing the fact that the fractional delay filters use incremental delays.
Figure 3:
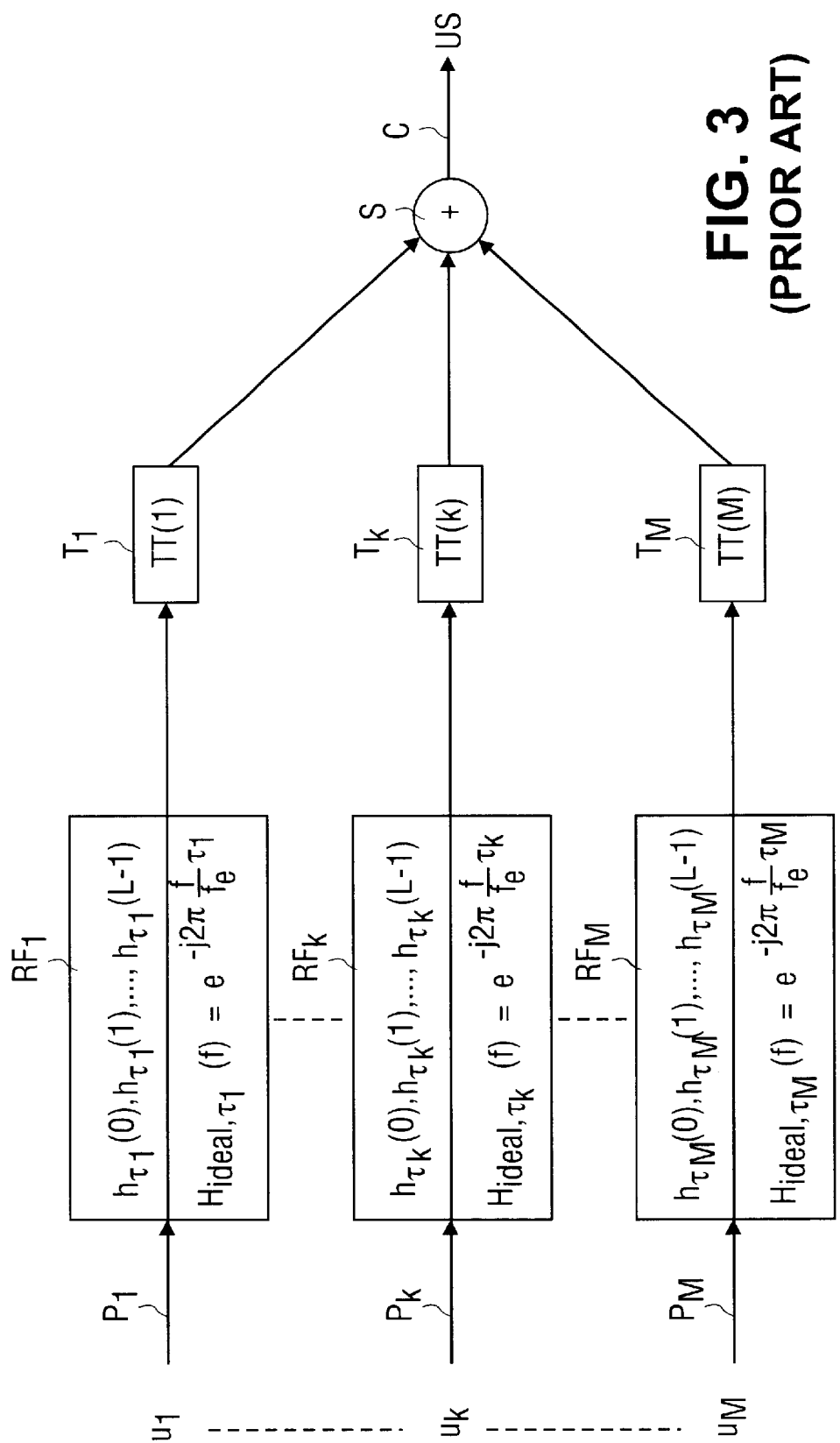
FIG. 3 shows the same device as FIG. 1, emphasizing the frequency domain transfer functions of the ideal delay filters approximated in this prior art device.
Figure 4:
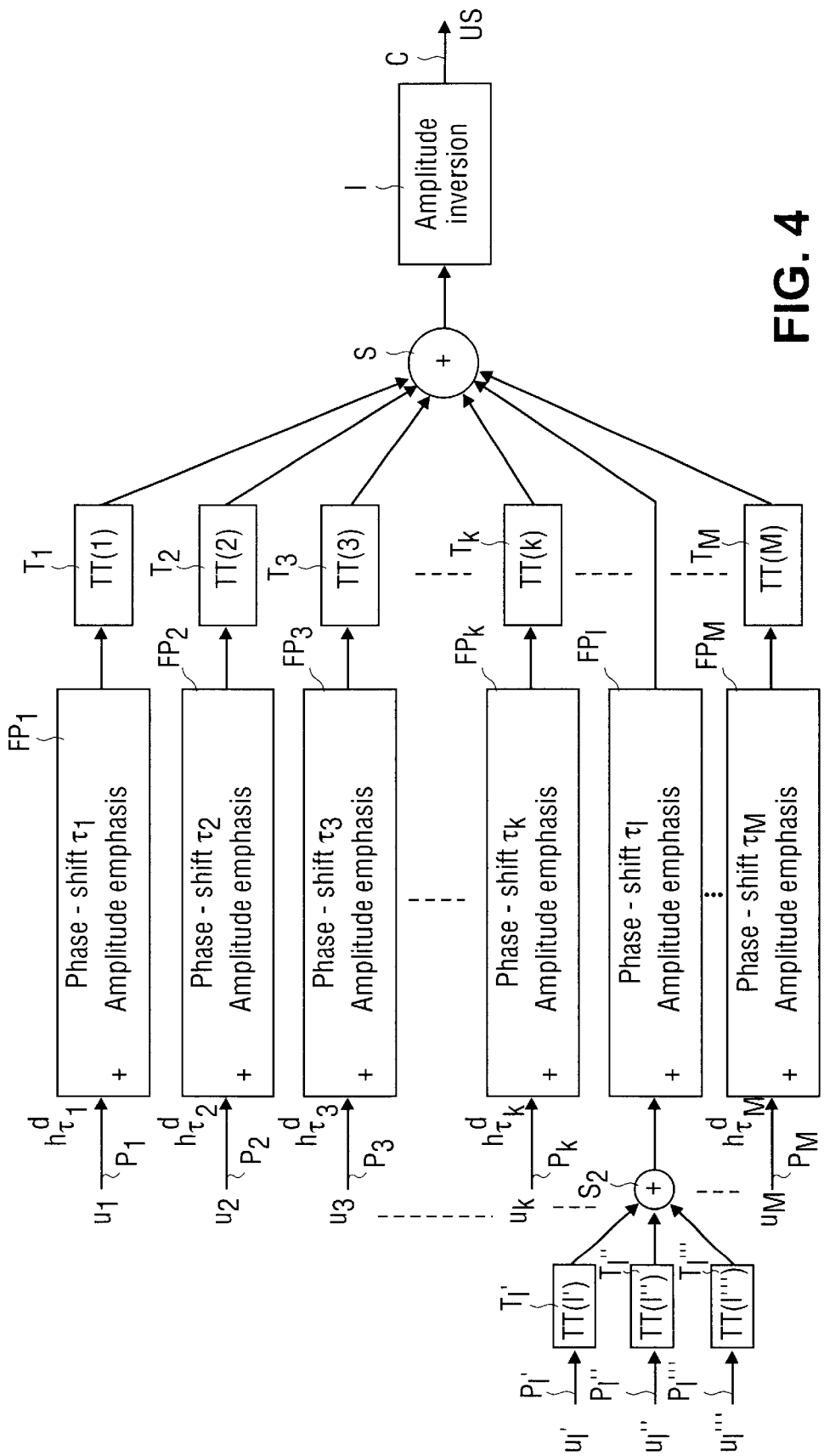
FIG. 4 is as functional block diagram of a digital processing device of the present invention.
Figure 5:
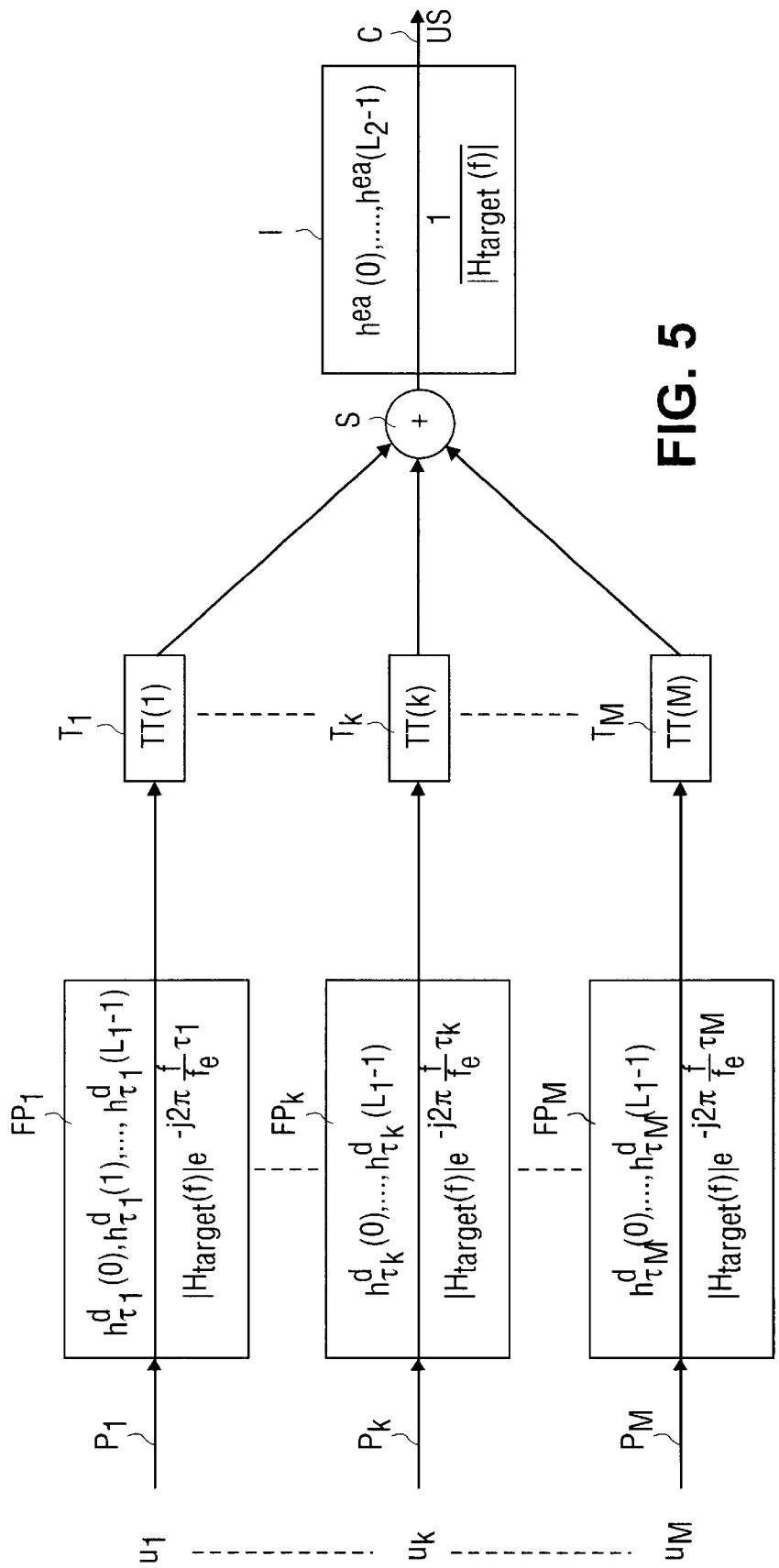
FIG. 5 shows the same device as FIG. 4, emphasizing approximated target filters.

FIGS. 4 and 5 show a device of the invention which processes M input signals $u_1, \ldots, u_M$ with the same result US as that produced by the device shown in FIGS. 1 to 3 and with the same computation accuracy.

In the above device, each of the M input signals $u_k$ is passed first through a first phase-shift filter $h_\tau^d(n)$ denoted $FP_k$ in FIGS. 4 and 5.

The phase-shift filters $FP_1, \ldots FP_M$ are finite impulse response filters of length $L_1$, each approximating a target filter, and whose coefficients are calculated by a conventional method like the method M3 previously indicated. The target filters approximated in this way are not ideal delay filters as in the previous case. The target filters are defined in the frequency domain by $$H_{target,\tau}(f) = |H_{target}(f)| e^{-j2\pi \frac{f}{f_e}(\tau+\tau_0)}$$

where $(\tau+\tau_0)$ is the required non-integer normalized delay, being an additional constant delay equal to an integer number of sampling periods, and $H_{target}(f)$ depends only on the frequency.

Hereinafter, the expression "normalized fractional delay" refers to the non-integer part of the normalized delay actually introduced.

The function $|H_{target}(f)|$ is the same for all the phase-shift filters $FP_1$ to $FP_M$. The function $|H_{target}(f)|$ therefore introduces the same input amplitude emphasis in each input filter.

Each input signal $u_k$, after passing through the phase-shift filter $h_{\tau_k}^d$ denoted $FP_k$ in FIGS. 4 and 5, corresponding to the required fractional delay $\tau_k$ for that signal $u_k$, is subjected to linear processing TT(k) by a linear processing filter $T_k$ specific to the input signal $u_k$. The signals are then added.

Immediately downstream of this summation is an equalization filter of amplitude I, also referred to hereinafter as the common inversion filter. The role of the filter I is to perform the operation which is the inverse of the amplitude emphasis $|H_{target}(f)|$ introduced by the phase-shift filters $h_{\tau_k}^d$ denoted $FP_k$. In a preferred embodiment of the invention, this is done by approximating a filter with the frequency domain transfer function $$H_{equal}(f) = \frac{1}{|H_{target}(f)|}.$$

In many cases, the main role of the device is to put a signal back into phase or noise into antiphase, to reinforce the wanted signal and reduce the noise. In these cases, the interrelationship of the phases and of the moduli of the different branches is important.

However, zero overall distortion is not always necessary. Also, the equalization filter I can be included in another filter which is required for other purposes, such as equalizing a transfer function, for example that of the sensors.

Here the common inversion filter I is an FIR filter. Its coefficients can be calculated by one of the methods M1 through M3 previously described, or by any conventional filter design algorithm.

A linear filter like thecommon inversion filter I produces the same effects on the output signal US whether it is applied to each of those signals on the upstream side of the summation S or to the summed signal.

The same processing is therefore applied to the signals between M input ports $P_1$ to $P_M$ and the common output port C if a single common inversion filter I is placed after the summation S or if M filters identical to the common inversion filter I are placed upstream of the summation S.

We know that for a given input signal two linear filters in series supply the same output signal regardless of their order.

Figure 6:
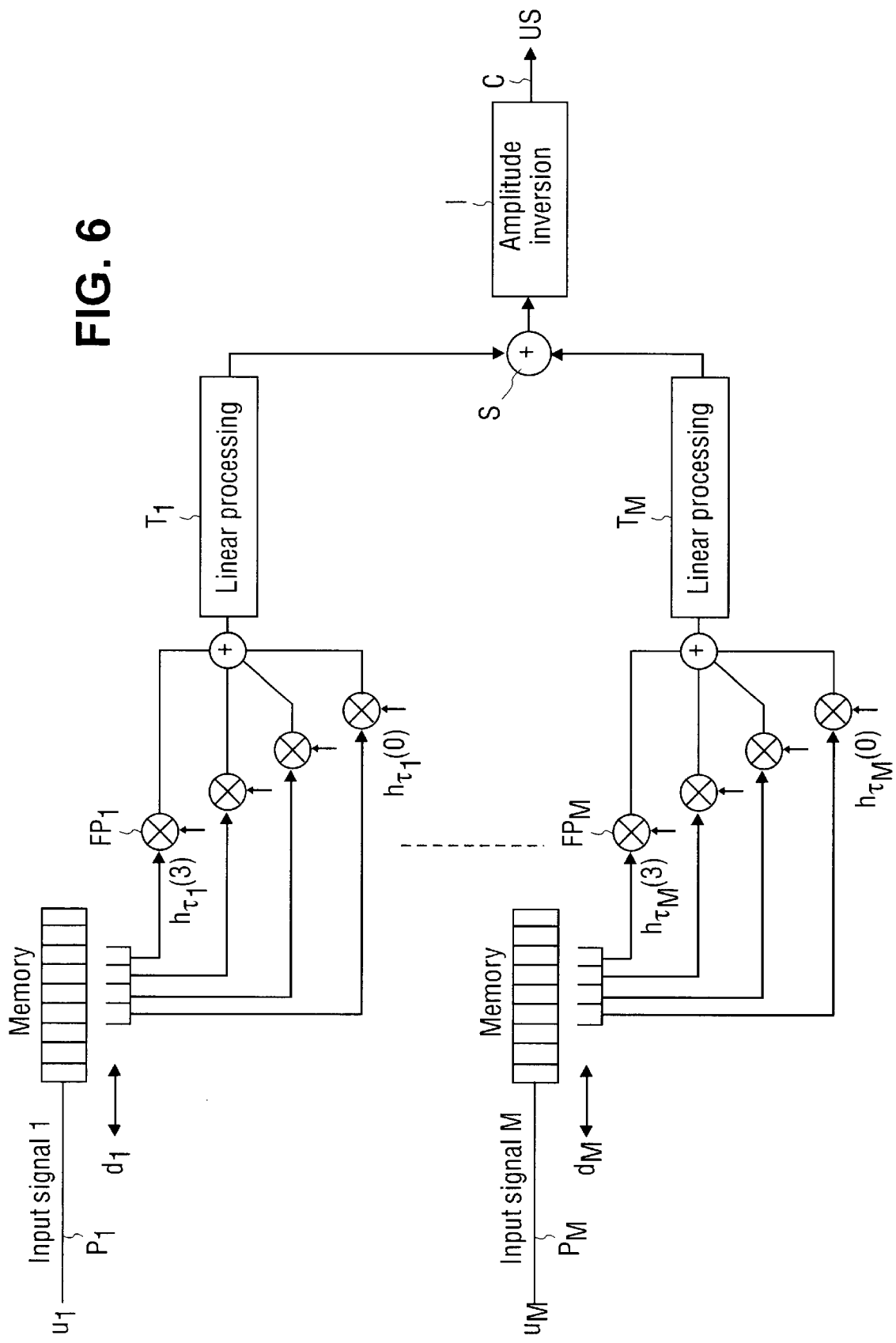
FIG. 6 shows a device of the invention similar to the device shown in FIGS. 4 and 5, including phase-shift filters with four coefficients.

A common inversion filter like that shown in FIGS. 4 to 6 and previously described therefore has the same effects on the output signal US of the entire device whether it is placed just upstream or just downstream of each of the specific linear processing operations $T_1$ to $T_M$.

Clearly, then, the common amplitude inversion filter I, placed downstream of the summation S, produces the same results as if M identical filters were placed between each particular phase-shift filter $h_{\tau_k}^d$ denoted $FP_k$ and the corresponding linear processing filter TT(k) denoted $T_k$.

In the light of the above explanations, each combination of a phase-shifter filters $FP_k$/and a common inversion filter I as shown in FIG. 4 clearly therefore has the same effect on the output signal US as if each combination were contiguous at the location of each phase-shift filter $FP_k$.

The transfer function of each of the contiguous pairs being equal to the product of the transfer functions of the phase-shift filter FP and the amplitude inversion filter I, each combination therefore constitutes a filter whose frequency domain transfer function is close to that of the ideal delay filter with transfer function $$|H_{target,\tau}(f)| = e^{-j2\pi \frac{f}{f_e}(\tau+\tau_0)}.$$

In one embodiment of the invention, the inversion filter I can also be an infinite impulse response filter. Because the equalization filter or amplitude inversion filter I does not vary with time, there is no "non-static" problem in this case.

If $L_1$ denotes the number of coefficients of the phase-shift filters $FP_1$ to $FP_M$ and $L_2$ denotes the number of coefficients of the equalization filter I, the device of the invention therefore performs $C_1 = M \cdot L_1 + L_2$ operations, an operation being defined as a multiplication followed by an addition.

The device stores the coefficients of D filters of length $L_1$ and one filter of length $L_2$, which represents a memory volume of $C_2 = D \cdot L_1 + L_2$ words.

The number M of input signals is in practice very large.

For a given reference fractional delay filter $h_\tau(n)$ the same phase-shift $\tau_1$ to the sum of the signals.

If respective linear processing TT(1'), TT(1"), TT(1"') is required for each input signal $u_1'$, $u_1"$, $u_1'''$, it is then necessary to place the linear processing filters $T_1'$, $T_1"$, $T_1'''$ upstream of the adder $S_2$, applied to each input signal $u_1'$, $u_1"$, $u_1'''$.

This produces a device in which there are no duplicated identical phase-shift filters. Thus the same operations are not performed at two different locations and the same set of coefficients is not stored twice.

A practical embodiment of a device of the kind shown diagrammatically in FIG. 6 will now be described.

In this numerical example, the wanted input signal frequency band is 0–7 kHz. The sampling period $f_e$ is 16 kHz. The number D of filters to be implemented, also referred to as the resolution, is 20. The number of inputs is M=32. The length of the phase-shift filters is L1=4 coefficients and the length of the common inversion FIR filter is $L_2$=11 coefficients.

The four coefficients of each phase-shifter filter are calculated by the generalized least squares algorithm, or method M3, and the seven coefficients of the amplitude inversion filter by a conventional linear phase finite impulse response filter design algorithm. The coefficients of the filters are normalized for calculation on a 16-bit fixed point DSP. The coefficients are as follows:

| i | $\tau_i = \frac{i}{D}$ | $h_i(0)$ | $h_i(1)$ | $h_i(2)$ | $h_i(3)$ |
|---|---|---|---|---|---|
| 0 | 0 | 14520 | 32767 | 14513 | −19 |
| 1 | 0.05 | 13290 | 32697 | 15779 | 198 |
| 2 | 0.1 | 12089 | 32504 | 17067 | 449 |
| 3 | 0.15 | 10926 | 32189 | 18368 | 741 |
| 4 | 0.2 | 9806 | 31756 | 19672 | 1078 |
| 5 | 0.25 | 8737 | 31208 | 20968 | 1466 |
| 6 | 0.3 | 7723 | 30550 | 22246 | 1909 |
| 7 | 0.35 | 6769 | 29789 | 23494 | 2410 |
| 8 | 0.4 | 5878 | 28931 | 24703 | 2973 |
| 9 | 0.45 | 5052 | 27985 | 25861 | 3600 |
| 10 | 0.5 | 4293 | 26958 | 26958 | 4293 |

The values for i=11, . . . , 19 are calculated using a relationship of symmetry $h_i(n)=h_{D-i}(L_1-1-n)$ in the present case where the additional delay $\tau_0$ is equal to $(L_1-2)/2$.

This property will now be demonstrated:

An FIR filter of length L, can take non-zero values for n=0, . . . , $L_1-1$. The point at the center of the impulse response is therefore $(L_1-1)/2$. Delays close to this value are easier to obtain than others. This is why a preferred embodiment of the invention seeks to approximate a normalized ideal phase-shift of $\tau+\tau_0$ where $\tau_0$ is fixed at $(L_1-2)/2$ and the normalized fractional delay $\tau$ varies in the range from 0 to 1, which gives a range of normalized delays that varies in the range from $(L_1-2)/2$ to $L_1/2$ and is symmetrical about the center $(L_1-1)/2$.

We also know that $\tilde{H}(f)=H^*(f)e^{-j2\pi f(L1-1)}$ (where $H^*(f)$ is the complex conjugate of $H(f)$) if $\tilde{h}(n)=h(L_1-1-n)$.

$H_\tau(f)$ approximates $$|H_{target}(f)| \cdot H_{ideal,\tau+\tau 0}(f) = |H_{target}(f)|e^{-j2\pi f(\tau+\tau_0)}$$

$$= |H_{target}(f)|e^{-j2\pi f(\tau+(L_1-2)/2)}$$

in which $\tilde{H}_\tau(f)=H^*(f)e^{-j2\pi f(L1-1)}$ approximates $$\begin{aligned}|H_{target}(f)| \cdot H^*_{ideal,\tau+\tau 0}(f)e^{-j2\pi f(L_1-1)} &= |H_{target}(f)| \cdot e^{+j2\pi f(\tau+\tau_0)}e^{-j2\pi f(L_1-1)}\\&= |H_{target}(f)| \cdot e^{-j2\pi f(L_1-1-(L_1-2)/2-\tau)}\\&= |H_{target}(f)| \cdot e^{-j2\pi f((L_1-2)/2+1-\tau)}\\&= |H_{target}(f)| \cdot H_{ideal,(1-\tau)+\tau 0}(f)\end{aligned}$$

so that $\tilde{H}_\tau(f)$ therefore approximates $H_{1-\tau}(f)$ and $\tilde{H}_{1+\tau}(f)$ approximates $H_\tau(f)$, whence $h_\tau$ is substantially equal to $\tilde{H}_{1+\tau}(f)$, in other words: of length L, the inventors have found after much work that it is possible to produce a combination of a phase-shift filter $FP_M$ and an amplitude inversion filter I in which the phase-shift filter $FP_k$ has a number $L_1$ of coefficients which is less than L, or even very small compared to L, and such that the computation accuracy of the combination of filters is similar to that of the reference filter $h_\tau(n)$.

A smoothed emphasis function $|H_{target}(f)|$ which has low values at half the sampling frequency is preferably chosen for this purpose.

These functions $|H_{target}(f)|$ are advantageously chosen from functions of the form $$|H_{target}(f)| = X + Y\left(1 + \cos\left(\frac{2\pi f}{f_e}\right)\right),$$

the ratio X/Y preferably being in the range from 0 to 0.3.

To normalize the value of $|H_{target}(f)|$ at f=0, X and Y preferably satisfy the condition X+2Y=1.

A preferred choice of the function $|H_{target}(f)|$ is $$|H_{target}(f)| = 0.06 + 0.47\left(1 + \cos\left(\frac{2\pi f}{f_e}\right)\right).$$

With this function $|H_{target}(f)|$, the coefficients of the filters are advantageously calculated by method M3 and the function $$W(f) = 1 \text{ for } f < \frac{6}{16}f_e;$$

$$W(f) = 5 \text{ for } \frac{6}{16}f_e \leq f < \frac{7}{16}f_e;$$

$$W(f) = 0.01 \text{ for } f > \frac{7}{16}f_e.$$

Thus $L_1$<L, or even $L_1$<<L and M>>1, which implies:

$M \cdot L_1+L_2$<<$M \cdot L$ and $D \cdot L_1+L_2$<<$D \cdot L$.

The computation load and the memory volume needed are therefore very small.

The computation load and the volume of memory needed can be made smaller if, as shown in FIG. 4, input signals $u_1'$, $u_1"$, $u_1'''$ are to be delayed with the same fractional delay $\tau_1$.

An adder $S_2$ to sum the signals is then placed on the upstream side of a phase-shift filter $FP_1$ which applies $h_\tau(n)=h_{1-\tau}(L_1-1-n)$ regardless of the value of n in the range from 0 to $L_1-1$.

This relationship of symmetry means that only the coefficients of half the necessary filters have to be stored in memory.

It is sufficient to store, as in the example explained here, the coefficients of the filters $h_\tau$ corresponding of normalized delays $(\tau+\tau_0)$ in the range from $$\frac{(L_1-2)}{2} \text{ to } \frac{(L_1-1)}{2}.$$

The filters $h_1T$ corresponding to normalized delays $1-\tau+\tau_0$ symmetrical to those delays $\tau+\tau_0$ about $(L_1\_1)/2$ are deduced using the relationship of symmetry $h_\tau(n)=h_{1-\tau}(L_1-1-n)$. In this way, for two phase-shift filters whose respective normalized fractional delays are symmetrical about a fractional delay equal to half the sampling period, the coefficients of one of the two filters are deduced from those of the other one using the abovementioned relationship.

For the finite impulse response amplitude inversion filter, we obtain for $h_{equal}(n)$ varying in the range from 0 to $L_2-1=10$: $-217, 747, -2914, 8225, -18117, 32767, -18117, 8225, -2914, 747, -217$.

If the phase must not be strictly linear, a third order infinite impulse response filter can be used with L2=7 coefficients whose zeros are: $-0.655$ and $0.0016\pm0.0383i$, and whose poles are: $-0.7089$ and $-0.5891\pm0.2122i$. This filter is calculated using the well-known Yule-Walker algorithm, for example.

The new structure is equivalent to a conventional structure with interpolation filters $h_{total}$, where $h_{total}(n)=h_\tau(n)*h_{equal}(n)$, * being the convolution operation.

In the case of the above device, the computation load is therefore $C_1=M\cdot L_1+L_2=32\times4+7=135$ operations and the memory required is $C_2=D\cdot L_1+L_2=20\times4+7=87$ words. FIG. 6 shows the structure of this filter in the form of a functional block diagram.

In the case of antenna processing, the delays $R_i$ with i varying in the range from 1 to M, for example, are chosen as a function of the antenna pointing angle.

The delays are then normalized and quantized. This yields the integer parts di and the fractional parts $r_i$ of the normalized delays:

$$r_{nq\cdot i} = \frac{round(D \cdot R_i \cdot f_e)}{D},$$

$d_i$=floor($r_{nq\cdot i}$) and $r_i=r_{nq\cdot i}-d_i$, where the round and floor fractions are respectively the integer approximation and integer part functions.

The resulting digital device has been compared with a prior art filter like that shown in FIGS. 1 to 3, in which the coefficients of the fractional delay filters were calculated using:

method M1 and L=20 (C1=640 operations, C2=400 words),
method M2 with a Hamming window and L=18 (C1=576, C2=360),
method M2 with a Blackman window and L=24 (C1=768, C2=480),
method M3 with L=12 and W(f)=1 in the wanted band 0–7 kHz (C1=384, C2=240),
method M3 with L=13 and W(f)=1 in the wanted band 0–7 kHz (C1=416, C2=260),
method M4 with L=30 (C1=960, C2=600).

The results obtained with a device of the invention are also shown, in which device the phase-shift filters have six coefficients and the filters are calculated using the same methods as for the filter of the invention with four coefficients previously described.

The ideal filters have a phase $\phi$ which increases linearly with the frequency f. The fraction $$\frac{-\varphi}{(2\pi f)},$$

referred to as the "phase delay", is therefore constant in the ideal case.

Figure 7:
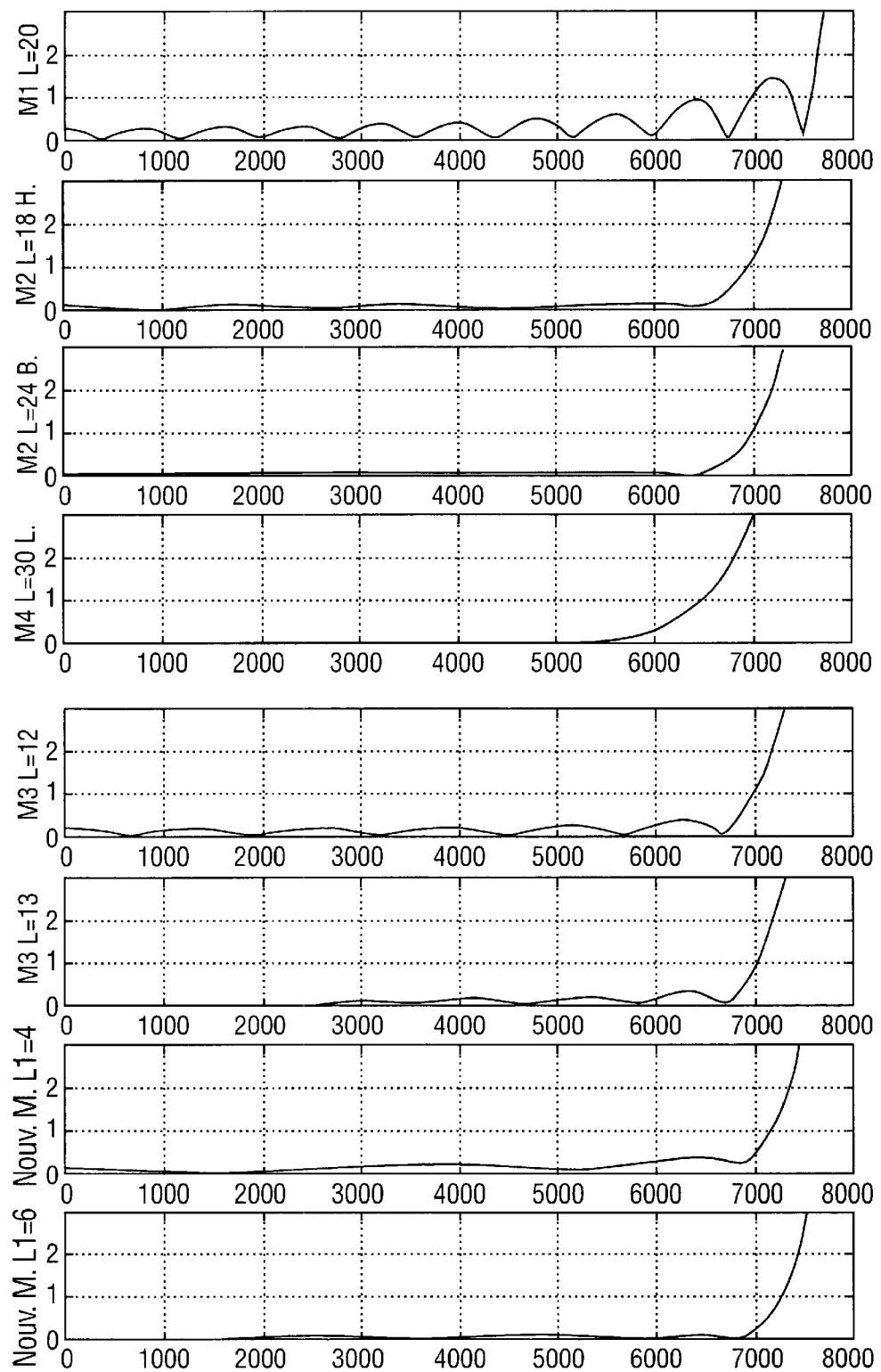
FIG. 7 shows maximum differences between Moduli for several fractional delays.

FIG. 7 shows the maximum differences between the moduli, i.e. $\max_{\tau_1\tau_2} (\||H_{\tau_1}(f)|-|H_{\tau_2}(f)|\|)$ for D=20 fractional delays.

It enables the quality of the phase-shift filters of the new method to be assessed. The amplitude inversion filter does not modify the difference between the moduli, i.e. the same results are obtained for $H_{total}(f)=H_\tau^d(f)H_{equal}(f)$ and for $H_\tau^d(f)$ alone. This figure can therefore be used to assess the quality of the phase-shift filters $H_\tau^d$.

The order of the other filters has been chosen to obtain a maximum amplitude error of around 1 dB, which corresponds to a factor of 1.12. In the worst case scenario, there is therefore a risk of having a residue due to the amplitude error of 0.12 (–18 dB) instead of cancellation for destructive interference.

It can be shown that the performance of all the filters is excellent for low frequencies up to 6 kHz, except for method M1. The maximum error is always at the maximum frequency of 7 kHz. The two examples of the new method have the lowest maximum error. The overall performance is satisfactory for the filter with four coefficients and excellent for the filter with six coefficients, which shows the better results from all the filters.

Figure 8:
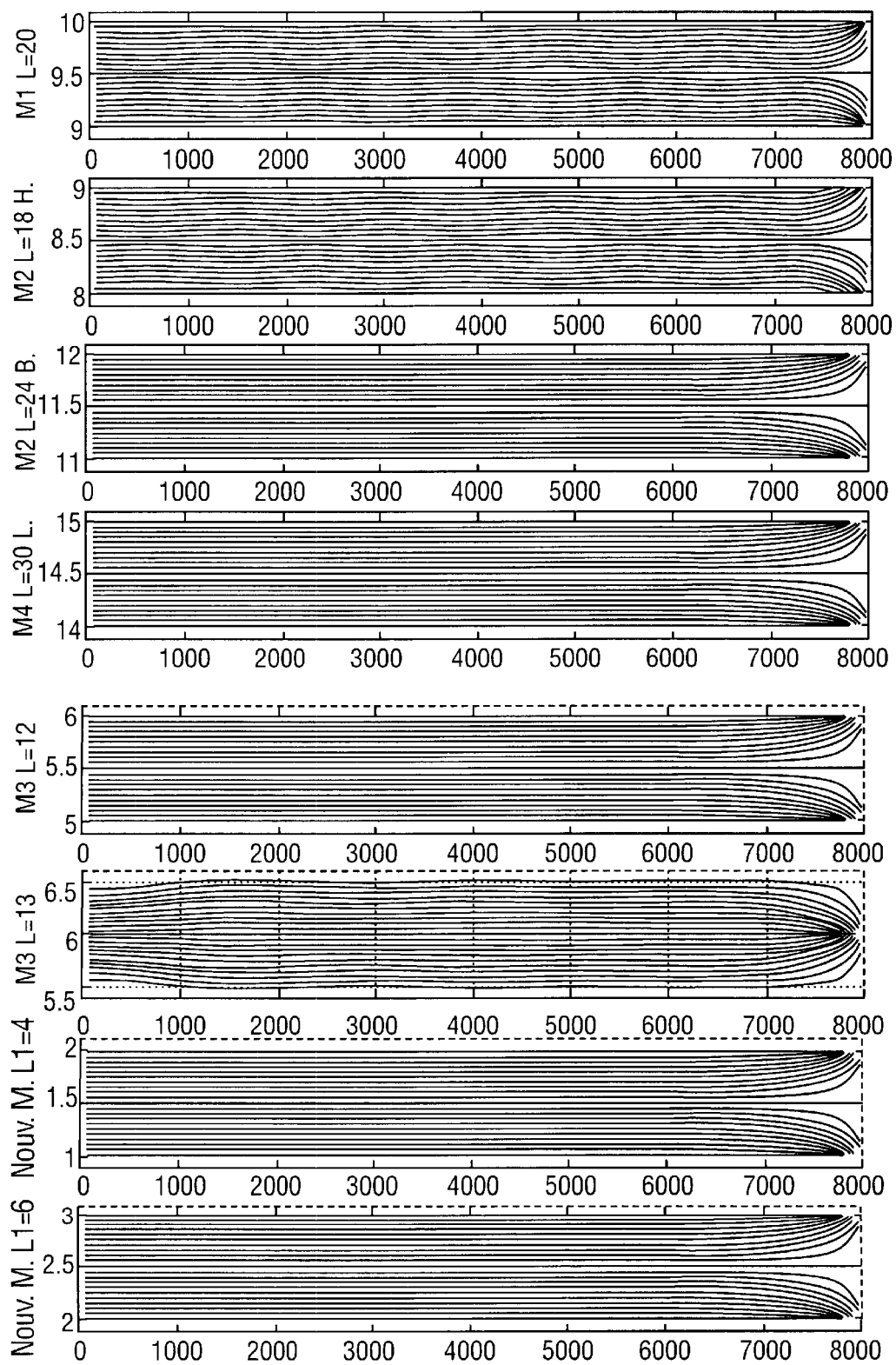
FIG. 8 shows phase delays each including the phase of a filter and the sampling frequency.

FIG. 8 shows the phase delays $$-\frac{\varphi_\tau(f)}{2\pi f}f_e,$$

where $\phi_\tau(f)$ is the phase of the filter $h_\tau^d$ and $f_e$ is the sampling frequency. It is difficult to assess the quality of the phase from this figure because errors at low frequencies are emphasized by the denominator and because it is not easy to compare two methods. It is included here to show that a filter of even length can be exact for the phase for integer and integer-and-a-half delays (referred to as linear phase filters) whereas an odd length filter cannot be exact for an integer-and-a-half delay. This is the main reason why filters of odd length are rarely used.

FIG. 8 also shows that at the maximum frequency the delays tend towards integer values except for the integer-and-a-half delay. This behavior is due to the fact that the discrete Fourier transform of a real sequence is always real at the maximum frequency. It follows from this that the phase is zero or $\pi$ or undefined because the modulus is zero. This explains why the phase of the filters departs from the target value at high frequencies.

Figure 9:
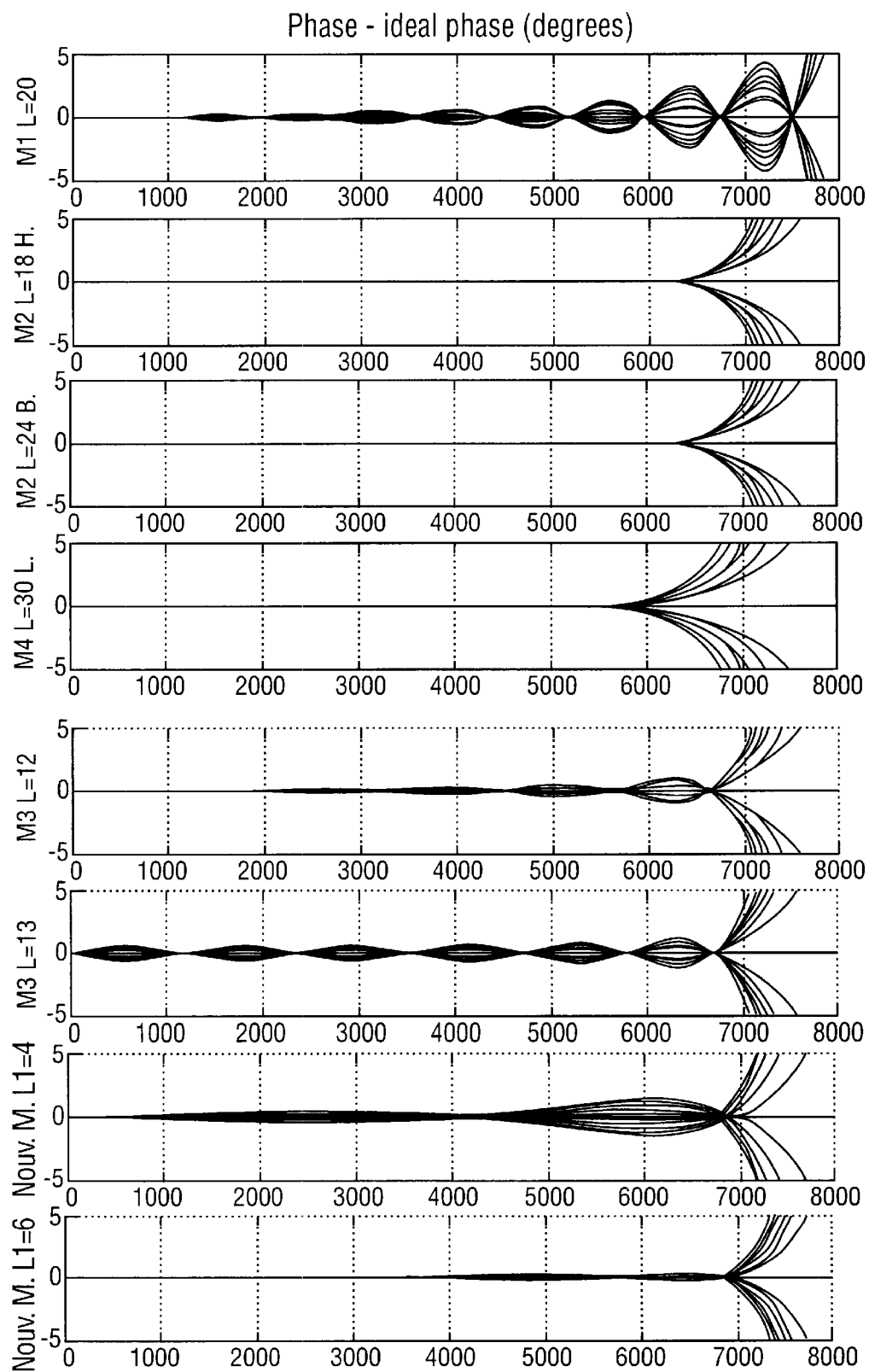
FIG. 9 shows phase errors, and constitute another representation of the phase-shift.

FIG. 9 shows the phase error $[(\phi_\tau(f)-\phi_{\tau,ideal}(f)]$, in other words this is another representation of the phase-shift. It is well suited to comparing the quality of the phase of the filters. The greatest phase errors still occur at the maximum wanted frequency of 7 kHz. The filter with four coefficients is subject to slightly greater phase error than most other filters. On the other hand, the new method has the smallest two maximum errors.

FIG. 9 can also be used to assess the accuracy with which the delay must be quantified. There is no benefit in storing a large number of filters if the filters are insufficiently accurate. At the maximum frequency, a delay of one sample corresponds to a phase-shift of 180°. Given the maximum phase error of approximately 3°, it is therefore reasonable to store more than 60 filters so that the delay quantizing error is less than the error introduced by the filter. Performance is degraded if the available memory is unable to store this many filters. This situation can arise in typical real time environments, for example in respect of the internal memory of a DSP. In this case, the new structure produces better results with low complexity.

Lagrange filters have excellent performance at low frequencies but the number of coefficients increases rapidly with the wanted frequency band. To obtain good behavior in the 0–7 kHz band, an excessive number of coefficients is required.

In the worst case scenario (excluding Lagrange), the maximum phase difference is equal to 7°, which yields the same residual error of 0.12 (−18 dB) as that due to the amplitude error.

Thus even the critical situation of destructive interference can be processed with only four operations per input and four coefficients to be stored for each fractional delay. Comparison with conventional interpolation filters (methods M1 to M3) show that the following can be obtained simultaneously:

a reduction of the computation load by a factor in the range from 3 to 8, a reduction in the memory requirement by a factor in the range from 3 to 8, with a smaller maximum error and good overall performance.

Because the interpolation is often the most costly processing operation, the method is particularly suitable for forming lobes for antenna processing. The figures with L1=6 show that this method is also very effective for applications that demand a very high accuracy.

Note that the above two examples of filters cover most existing applications of fractional delay filters.

It is rare to need delay filters having less than four coefficients and there is rarely a need for an accuracy better than that obtained with the second example, for which $L_1$=6.

The remainder of the description covers one embodiment of a digital filter of the invention and conforming to that described above, in which the parameters $L_1$, $L_2$ and D are respectively equal to 4, 19 and 60. This example is given by way of illustration only, in the form of a program written in C. The coefficients of the filter routine 1.C were calculated in advance using the previously mentioned functions $|H_{target}(f)|$ and $W(f)$.

Figure 10:
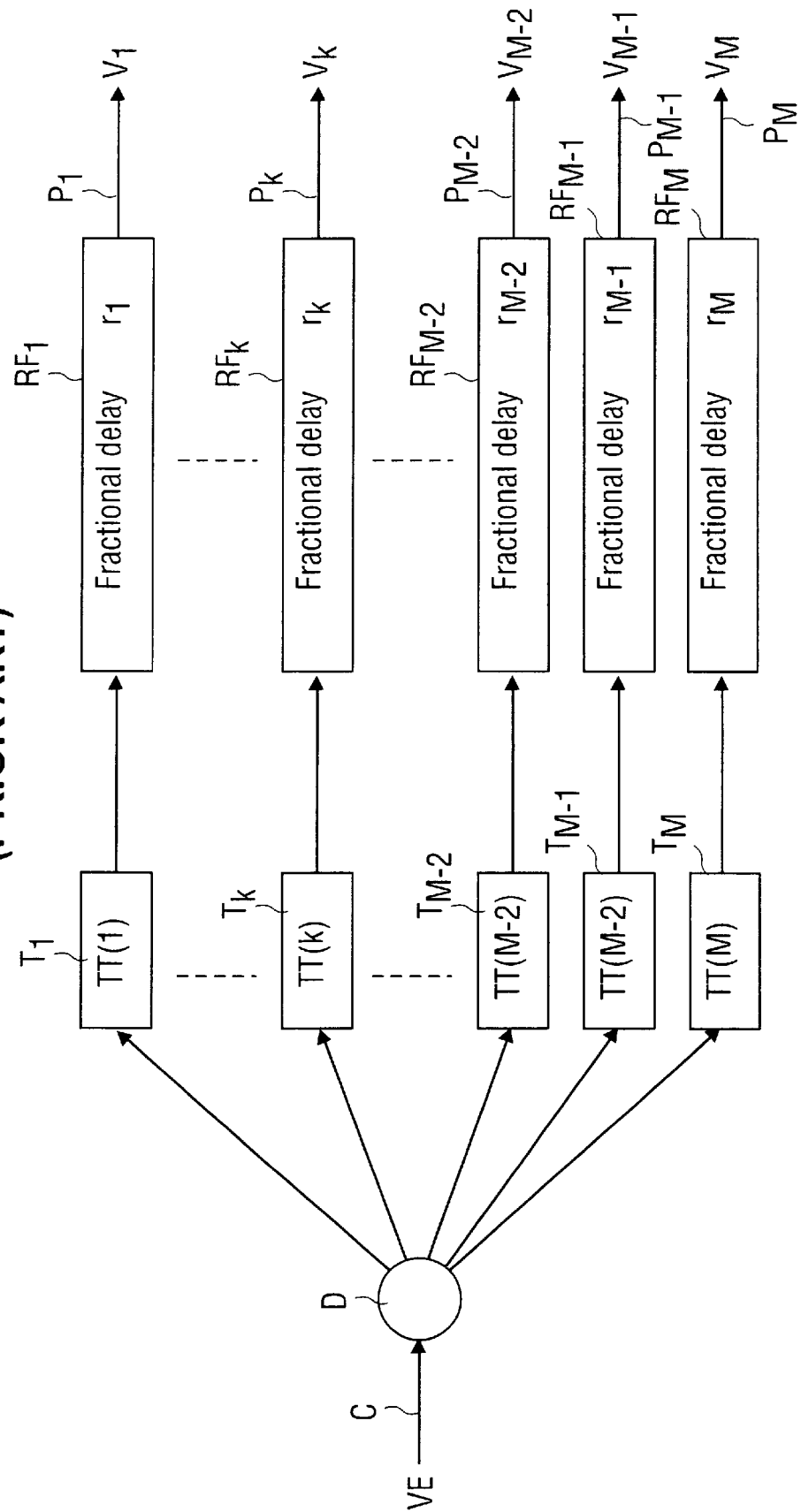
FIG. 10 represents a prior art device for providing specific output signals, each resulting from linear processing followed by fractional delays followed by respective filters.

The purpose of the prior art device shown in FIG. 10 is to provide M specific output signals $V_k$ (with k varying in the range from 1 to M) each resulting from linear processing TT(k) performed by a filter $T_k$ followed by a fractional delay formed by a filter $RF_k$, based on the same input signal VE.

This problem arises in fractional pitch resolution voice coders, for example. Several voice coders use the following equations to determine the pitch P:

$$x = (x(n), x(n-1), \ldots, x(n-N+1)),$$

$$y = (x(n-P), x(n-P-1), \ldots, x(n-P-N+1))$$

$$P = \mathrm{argmax}\frac{\langle x, y \rangle}{\|y\|^2}$$

To obtain a fractional resolution of the pitch P, the signal x must be delayed by a fractional delay.

As shown in FIG. 10, the device includes on the input side a device D which first duplicates the input signal VE in the form of M signals VE' identical to it, after which each of the signals VE' is passed through a linear processing filter $T_k$ applying linear processing TT(k), followed by a fractional delay filter $RF_k$ introducing a fractional delay $r_k$.

Figure 11:
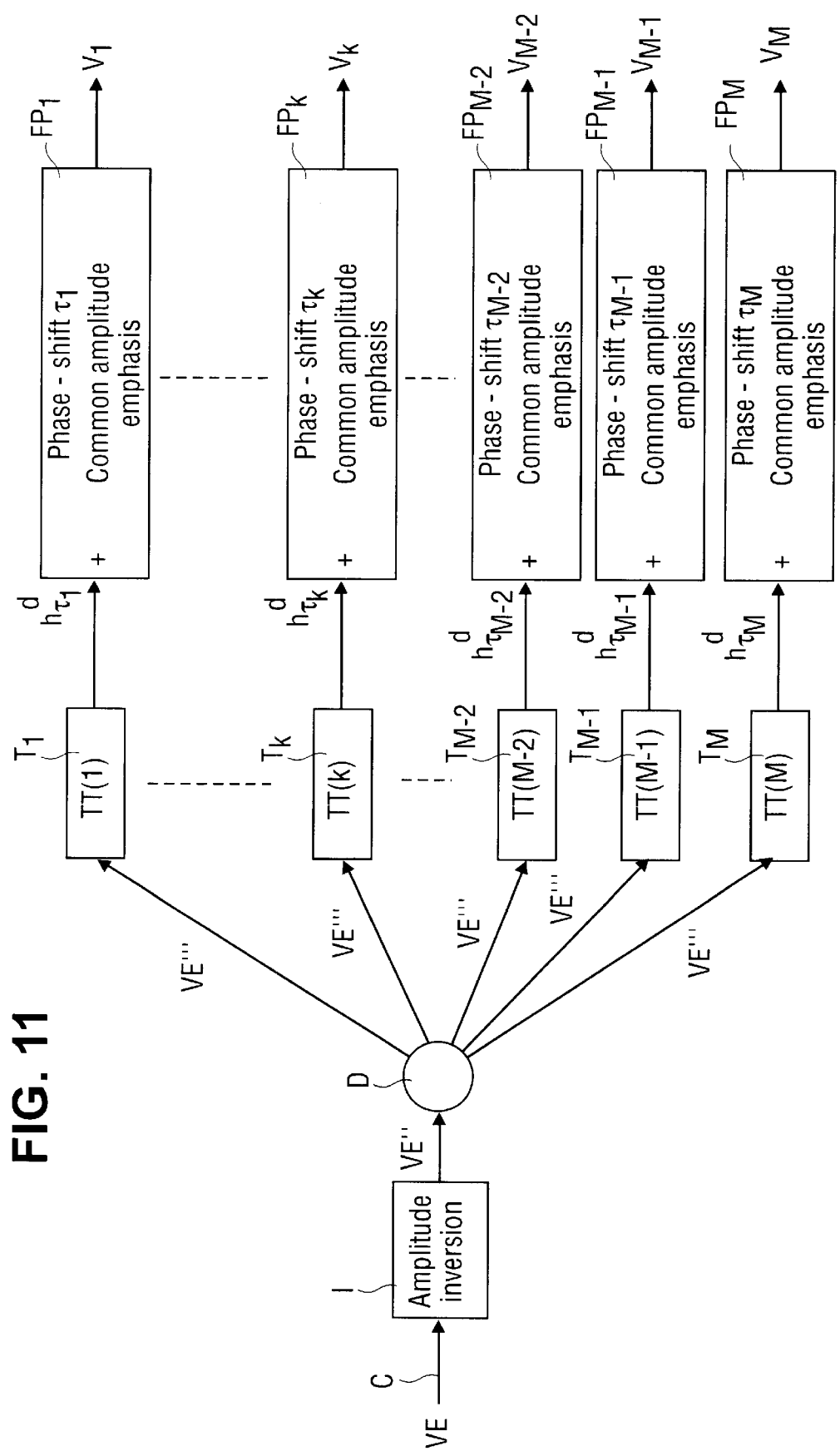
FIG. 11 shows a digital processing device according to the present invention, in which ay single input signal is processes to produce several output signals similar to those obtained with the device of FIG. 10.

FIG. 11 shows a digital processing device of the present invention in which a single input signal VE is processed to produce M output signals $V_1$ to $V_M$ similar to those obtained with the device from FIG. 10. The components are similar to those of the device shown in FIGS. 4 to 6, that is to say phase-shift filters $h_{r_k}^{d}(n)$ denoted $FP_1$, $FP_2$, ..., $FP_M$, where k varies in the range from 1 to M, linear processing filters $T_k$, where k varies in the range from 1 to M, and an amplitude inversion filter I.

The amplitude inversion filter I applies amplitude pre-emphasis to the input signal VE. To be more precise, the transfer function of the filter I has a non-constant modulus and a zero phase. The resulting signal VE" is then duplicated by a device D to produce M identical signals VE'''. Each of the signals VE''' is subjected to specific linear processing TT(k) (with k varying in the range from 1 to M) by a filter $T_k$ and is then passed through a specific phase-shift filter $h_{r_k}^{d}$ denoted $FP_k$.

Each phase-shift filter $FP_k$ is an approximation of a target filter whose transfer function has the following features:

Its phase is close to that of the ideal fractional delay filter introducing the delay $r_k$ required for the output signal, i.e. its phase is close to $-2\pi r_k f$.

Its modulus is the inverse function of the modulus of the amplitude inversion I on the input side of the device. As in the device shown in FIGS. 3 and 4, the amplitude inversion filter clearly has the same effect as if it were applied to each duplicated signal just upstream of the phase-shift filters $h_{r_k}^{d}$ denoted $FP_k$, with k varying in the range from 1 to M.

In FIG. 10, as in FIGS. 1 and 2, the computation load is $C_1$=M·L operations. For the same reasons, D filters of length L are stored, i.e. $C_2$=D×L words in memory, whereas in the case of the device from FIG. 11 the computation load is $C_1$=M·$L_1$+$L_2$ operations and the memory required is D·$L_1$+$L_2$ words, where $L_1$ is the length of the phase-shift filters and $L_2$ is the length of the amplitude inversion filter.

In the same manner as previously, an amplitude pre-emphasis filter I/phase-shift filter $FP_k$ combination having the same performance as a fractional delay filter $RF_k$ of length L can be obtained in which the length $L_1$ of the phase-shift filter $FP_k$ is less than, or even very small compared to, the length L of the delay filter $RF_k$. The device shown in FIG. 11 then produces the same result with the same accuracy as the device from FIG. 10 and with a greatly reduced computation load and memory requirement.

Of course, the invention is not limited to the embodiments described. It encompasses any variant in accordance with the spirit of the invention.

In particular, the common amplitude emphasis filter I can also be used to equalize a transfer function, for example that of a sensor.

More generally, the invention is not limited to interpolation filters but can be used for other linear processing with either a large number of inputs or a large number of outputs.

```
Program in C
main.c program page 1
/* application to beamforming algorithm */
#include "cons.h"
#include <stdio.h>
#include <math.h>
/* antenna geometrie */
const float xposition[] = {0,.1,.2,.3,.4,.5,.6,.7,.8,.9};
const float xmin=0;
const float xmax=.9;
/* filter1 for phase shift introducing amplitude distortion */
/* filter2 for amplitude egalisation */
long filter1 (short*, int, struct delay*, float*);
int filter2(long*)
struct delay *calcdelay(float,int);
int main(int argc, char*argv[])
{
    /***********************************************/
    /* declaration */
    struct delay *del;              /* integer and fract. part*/
    char *infile,*outfile,*parfile; /*    file names */
    int i,m;                        /* loop variables */
    int delmax,base;                /* max. delay, address offset */
    int neof,                       /* not_end_of file */
    long out1;                      /* output filter 1 */
    short out2;                     /* output filter 2 */
    float phi                       /* steering angle */
    float shaping[M];               /* microphone weighting */
    short indata[INBUFFER] [M];     /*input buffer */
    long outdata[L2];               /* buffer for second filter */
    FILE *infpt,*outfpt,*parfpt;    /*file pointer */
    /***********************************************/
    /* get command line parameters infile, outfile, parameter file*/
    if (argc!=4)
    {
                                    printf("use frac in_file out_file
    parameter_file\n")
        return(-1 );
    }
    infile=argv[1];outfile=argv[2]; parfile=argv[3];
    infpt=fopen(infile, "rb") ;outfpt=fopen(outfile, "wb");parfpt=fopen
    (parfile,rb");
    if ((infpt==NULL) | (outfpt==NULL) | (parfile==NULL))
    {
        printf("unable to open input or output or parameter file");
        return(-2);
    }
    /***********************************************/
    /* maximum delay */
    delmax =(int) ((xmax-xmin) *Fs/c);
    if (delmax+L1 >INBUFFER)
    {
        printf("Input Buffer too small");
        return(-3);
    }
main.c program page 2
    /***********************************************/
    /* get multiplexed input data from infile and put into indata */
    fread(indata,M*sizeof(short),(delmax+L1),infpt);
    base=delmax+LI;
    /***********************************************/
    /* main loop for each sample */
    for (neof= 1;neof>0;)
    {
        /* read input data and steering parameters */
        base=( (base+1)%INBUFFER);
        fread(&indata[base] [0],M*sizeof(short),1,infpt)
        neof=fread(&phi,sizeof(float),1,parfpt)
        fread(shaping,sizeof(float),M,parfpt);
        /* compute integer and fractionnal delay for each
        microphone */
        del=calcdelay(phi,delmax);
        /* beamforming by delay-weighting-sum */
        out1=filter1(&indata[0] [0],base,del,shaping);
        /* the second filter shift loop */
        for (i=O;i<L2-1;i++)
                outdata [i]=outdata1 [i+1];
        outdata{L2- 1)=out 1;
        out2=filter2(outdata);
```

```c
            fwrite(&out2,sizeof(short),1,outfpt);
        }
        return(0);
    }
``` filter1.c program page 1

```c
    /* performs delay - weighting - sum beamforming */
    /* Wolfgang Tager, 28.10.96 */
    #include "cons.h"
    #include "math.h"
        float abs(float); /* since default is int */
        long filter1(short indata[INBUFFER] [M],int base,struct delay
    *del,float shaping [M])
    }
        static int f1coeff[RESOL] [L1] =
        {
            {14520    ,32767    ,14513    ,-19},
            {14108    ,32757    ,14932    ,50},
            {13697    ,32734    ,15354    ,122},
            {13290    ,32697    ,15779    ,198},
            {12886    ,32646    ,16206    ,277},
            {12486    ,32582    ,16636    ,361},
            {12089    ,32504    ,17067    ,449},
            {11697    ,32412    ,17500    ,541},
            {11309    ,32307    ,17934    ,639},
            {10926    ,32189    ,18368    ,741},
            {10547    ,32058    ,18803    ,848},
            {10174    ,31913    ,19238    ,960},
            {9806     ,31756    ,19672    ,1078},
            {9444     ,31586    ,20106    ,1202},
            {9087     ,31403    ,20538    ,1331},
            {8737     ,31208    ,20968    ,1466},
            {8392     ,31001    ,21397    ,1607},
            {8055     ,30781    ,21823    ,1755},
            {7723     ,30550    ,22246    ,1909},
            {7398     ,30308    ,22666    ,2069},
            {7080     ,30054    ,23082    ,2236},
            {6769     ,29789    ,23494    ,2410},
            {6465     ,29514    ,23902    ,2590},
            {6168     ,29228    ,24305    ,2778},
            {5878     ,28931    ,24703    ,2973},
            {5596     ,28625    ,25095    ,3174},
            {5320     ,28310    ,25481    ,3384},
            {5052     ,27985    ,25861    ,3600},
            {4792     ,27651    ,26234    ,3823},
            {4539     ,27309    ,26600    ,4054},
            {4293     ,26958    ,26958    ,4293},
            {4054     ,26600    ,27309    ,4539},
            {3823     ,26234    ,27651    ,4792},
            {3600     ,25861    ,27985    ,5052},
            {3384     ,25481    ,28310    ,5320},
            {3174     ,25095    ,28625    ,5569},
            {2973     ,24703    ,28931    ,5878},
            {2778     ,24305    ,29228    ,6168},
            {2590     ,23902    ,29514    ,6465},
            {2410     ,23494    ,29789    ,6769},
            {2236     ,23082    ,30054    ,7080},
            {2069     ,22666    ,30308    ,7398},
            {1909     ,22246    ,30550    ,7723},
            {1755     ,21823    ,30781    ,8055},
            {1607     ,21397    ,31001    ,8392},
            {1466     ,20968    ,31208    ,8737},
            {1331     ,20538    ,31403    ,9087},
            {1202     ,20106    ,31586    ,9444},
            {1078     ,19672    ,31756    ,9806},
            {960      ,19238    ,31913    ,10174},
            {848      ,18803    ,32058    ,10547},
            {741      ,18368    ,32189    ,10926},
            {639      ,17934    ,32307    ,11309},
            {541      ,17500    ,32412    ,11697},
            {449      ,17067    ,32504    ,12089},
            {361      ,16636    ,32582    ,12486},
            {277      ,16206    ,32646    ,12886},
            {198      ,15779    ,32697    ,13290}
            {122      ,15354    ,32734    ,13697}
            {50       ,14932    ,32757    ,14109}
    };
``` filter1.c program page 2

```c
    long filtout,    /* integer calculation for fast exact results
                        no overflow for a single microphone
```

-continued

```
                        since sum_over_i(abs(f1 coeff[r] [i]))<65536 */
    float sumout=O;
    int m,i,firstel; /*loop counters, first element for fract. filter*/
    /******************************************/
    /* delay - weighting - sum                                     */
    for (m=O;m<M;m++)
    {
            filtout=O,
            firstel=base-del[m] .integer,
                            /* integer delay compensation */
            for (i=O;i<L1;i++)
                    filtout+=f1coeff[del[m] .frac][i]*indata    [(firstel-
                            i+INBUFFER)%INBUFFER] [m];
            sumout=sumout+shaping [m]*filtout;
    }
    /******************************************/
    /* normalisation and saturation if necessary
    (does not occur if sum(abs(shaping))<M    */
    sumout=(sumout/M);
    sumout=sumout/(11<<16);
    if (abs(surnout)>32767)
    {
        printf("\nsumout filter 1 exceeds 16 bits: %f ",sumout);
        printf("\nlimited to saturation value ");
        if (sumout>O)
                    sumout=32767;
        else
                    sumout=-32767;
        end
        getchar();
    }
    return( (long) sumout );
}
calcdelay.c, filter2.c and cons.h programs
/* calculate integer and fractionnal delay for plane wave          */
/* impinging on a linear array under an angle phi                  */
/* can be adapted to other arrays and/or nearfield equations       */
/* wolfgang Tager, 28.10.96                                        */
#include "cons.h"
#include <math.h>
#include <stdio.h>
struct delay *calcdelay(float phi,int delmax)
{
    extern float xposition[ ];
    extern float xmax;
    static struct delay del [M];
    int m;
    float tmp;
    for (m=0;m<M;m++)
    {
            tmp=delmax- (xmax-xposition[m])*cos(phi)*Fs/c + .5 /RESOL;
            del[m] .integer=(int) tmp;
            del *[m] .frac=(int) (RESOL* (tmp-del 8 m] .integer));
    }
    return del;
}
/* amplitude egalisation filter */
/* wolfgang Tager, 28.10.96 */
#include "cons.h"
int filter2(long* outdata)
{
    static int f2coeff[L2]=
    { -30,66,-189,512,-1246,2760,-5649, 10760,-19311,32767,-19311,
      10760,-5639,2760,-1246,512,-189,66,-30};
    char shift=17;                    /* sum(abs(f2coeff)) < 2^17*/
    int i;
    float filtout=0;
    for (i=0,i<L2;i++)
            filtout+=f2coeff[i]*outdata[i]
    return( (int) (filtout/ (I1<<shift) ) );
}
#define     M           10
#define     INBUFFER    1000
#define     RESOL       60
#define     L 1         4
#define     L2          19
#define     Fs          8000
```

-continued

```
#define        c        340
struct delay
{
              int integer,
              int frac;
};
```

What is claimed is:

1. A device for processing digital signals conveyed between a common port (C) and a plurality of M ports ($P_1, \ldots, P_M$) including a linear processing module ($T_1, \ldots, T_M$), characterized in that said device includes particular a plurality of filters ($FP_1, \ldots, FP_M$) which simultaneously apply a phase-shift and a chosen amplitude emphasis at each of the plurality of M ports ($P_1, \ldots, P_M$), said phase-shift being specific to each of said plurality of ports ($P_1, \ldots, P_M$) and the amplitude emphasis being substantially the same for all of said plurality of ports ($P_1, \ldots, P_M$) and in that said device includes at said common port (C) a common inversion filter (I) which performs the inverse amplitude emphasis to said chosen amplitude emphasis.

2. A device according to claim 1, characterized in that the common port (C) is a port for receiving an input signal (VE) and in that the plurality of M ports ($P_1, \ldots, P_M$) are ports for transmitting a plurality of output signals ($V_1, \ldots, V_M$).

3. A device according to claim 1, characterized in that the plurality of M ports ($P_1, \ldots, P_M$) are ports for receiving a plurality of input signals ($U_1, \ldots, U_M$) and in that the common port (C) is a port for transmitting an output signal (US).

4. A device according to claim 1, characterized in that each of the plurality of M filters ($FP_1, \ldots, FP_M$) has a frequency domain transfer function which approximates a function whose phase is $2\pi f r$ where f is the frequency and r is a delay having a fractional part specific to each of the plurality of ports ($P_1, \ldots, P_M$).

5. A device according to claim 1, characterized in that each of the plurality of M filters ($FP_1, \ldots, FP_M$) has a frequency domain transfer function whose modulus approximates an amplitude emphasis function which is a smoothed function having low values around half the sampling frequency of said signals.

6. A device according to claim 1, characterized in that each of the plurality of M filters ($FP_1, \ldots, FP_M$) has a frequency mode transfer function whose modulus approximates an amplitude function $|H_{target}(f)|$ of the form:

$$|H_{target}(f)| = X + Y\left[1 + \cos\left[\frac{2\pi f}{f_e}\right]\right]$$

where the ratio X/Y is in the range from 0 to 0.3.

7. A device according to claim 6, wherein X is taken as equal to 0.06 and Y is taken as equal to 0.47.

8. A device according to claims 1, characterized in that the linear processing module includes particular a plurality of linear processing filters ($T_1, \ldots, T_M$) adjacent said plurality of filters ($FP_1, \ldots, FP_M$).

9. A device according to any one of claims 4 to 8, characterized in that the plurality of M ports ($P_1, \ldots, P_M$) are ports for receiving a plurality of input signals ($U_1, \ldots, U_M$) and in that the common port (C) is a port for transmitting an output signal (US), and in that the device includes a device (S) for summing signals on the input side of the common inversion filter (I).

10. A device according to claim 9, characterized in that the linear processing module includes a plurality of linear processing filters ($T_1, \ldots, T_M$) adjacent said plurality of filters ($FP_1, \ldots, FP_M$), and in that the summing device (S) is directly downstream of each of said plurality of linear processing filters ($T_1, \ldots, T_M$).

11. A device according to any one of claims 4 to 8, characterized in that the common port (C) is a port for receiving an input signal (VE) and in that the plurality of M ($P_1, \ldots, P_M$) are ports for transmitting a plurality of output signals ($V_1, \ldots, V_M$) and in that the device includes a device (D) for duplicating a signal into a plurality of signals identical to the signal downstream of the common inversion filter (I).

12. A device according to claim 11, characterized in that the linear processing module includes a plurality of linear processing filters ($T_1, \ldots, T_M$) adjacent said plurality of filters ($FP_1, \ldots, FP_M$) and in that the device (D) for duplicating a signal into a plurality of signals identical to the signal is directly upstream of each of said plurality of linear processing filters ($T_1, \ldots, T_M$).

13. A device according to claim 1, characterized in that the common inversion filter (I) is a finite impulse response filter.

14. A device according to claim 1, characterized in that the common inversion filter (I) is an infinite impulse response filter.

15. A device according to claim 1, characterized in that each of the plurality of filters ($FP_1, \ldots, FP_M$) has the same number of coefficients $L_1$.

16. A device according to claim 15, characterized in that, for two particular filters $h_1$ and $h_2$ whose respective normalized fractional delays are symmetrical about a delay equal to half the sampling period, the coefficients $h_1(n)$ of only one of the two filters are stored in memory, the coefficients $h_2(n)$ of the other filter being deduced from the equation $h_2(n)=h_1(L_1-1-n)$, n varying in the range from 0 to $(L_1-1)$.

17. A device according to claim 9, characterized in that additional summing devices ($S_2$) are provided upstream of selected ones of said plurality of filters ($FP_1, \ldots, FP_M$), each receiving a plurality of input signals to be delayed by the same fractional delay, so that the device has no duplicated identical filters among the plurality of filters ($FP_1, \ldots, FP_M$).

* * * * *